United States Patent
Higure

(10) Patent No.: US 7,149,263 B2
(45) Date of Patent: Dec. 12, 2006

(54) AGC METHOD AND CIRCUIT FOR DIGITAL RADIO RECEIVER

(75) Inventor: Kinichi Higure, Kiyose (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 1192 days.

(21) Appl. No.: 09/886,210

(22) Filed: Jun. 22, 2001

(65) Prior Publication Data

US 2001/0055350 A1  Dec. 27, 2001

(30) Foreign Application Priority Data

Jun. 26, 2000  (JP) .............................. 2000-190504

(51) Int. Cl.
*H04L 27/08* (2006.01)
(52) U.S. Cl. .................. 375/345; 330/278; 455/234.1; 342/92
(58) Field of Classification Search ................ 375/345; 330/129, 278; 455/234.1, 232.1, 245.1; 329/360; 342/92
See application file for complete search history.

(56) References Cited

U.S. PATENT DOCUMENTS 3,613,012 A * 10/1971 Feistel ........................ 375/351
4,531,089 A * 7/1985 Ishizuka et al. .......... 324/99 D

* cited by examiner

*Primary Examiner*—Temesghen Ghebretinsae
(74) *Attorney, Agent, or Firm*—Mattingly, Stanger, Malur & Brundidge, P.C.

(57) ABSTRACT

A gain of an amplifier of a receiver is automatically controlled based on a level of a signal received by the receiver. The instantaneous value of the envelope of the received signal is detected sequentially at predetermined time intervals. The first interval average value providing an average of the instantaneous value for a first predetermined time length, and the second interval average value providing an average of the instantaneous value for a second predetermined time length are determined. The difference between the instantaneous value and the first interval average value is determined. When the difference exceeds a predetermined threshold value, the gain of the amplifier corresponding to the second interval average value is set after a predetermined third time length.

14 Claims, 8 Drawing Sheets

FIG. 4

| LP+R | Pb | RI | SW | Pb | PI | G |
|---|---|---|---|---|---|---|
| 40 | 88 | 56 | 32 | 56 | 104 | 8 |

LP+R: LINEARIZER PREAMBLE LINE-UP
Pb:   PREAMBLE
RI:   COMMUNICATION INFORMATION CHANNEL
SW:  SYNC WORD
PI:   PARAMETER INFORMATION CHANNEL
G:    GUARD TIME

FIG. 5

| LP+R | Pb | Tch | RI | SW | UD | Tch |
|---|---|---|---|---|---|---|
| 40 | 2 | 96 | 56 | 32 | 20 | 160 |

LP+R: LINEARIZER PREAMBLE LINE-UP
Pb:   PREAMBLE
Tch:  COMMUNICATION CHANNEL
RI    COMMUNICATION INFORMATION CHANNEL
SW:  SYNC WORD
UD:  UNDEFINED PORTION

FIG. 6

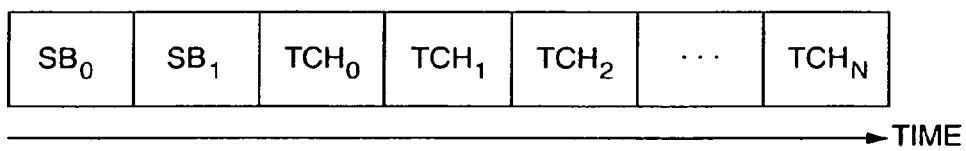

$SB_0$, $SB_1$ : SYNC BURST
$TCH_N$     : TRAFFIC CHANNEL FRAME

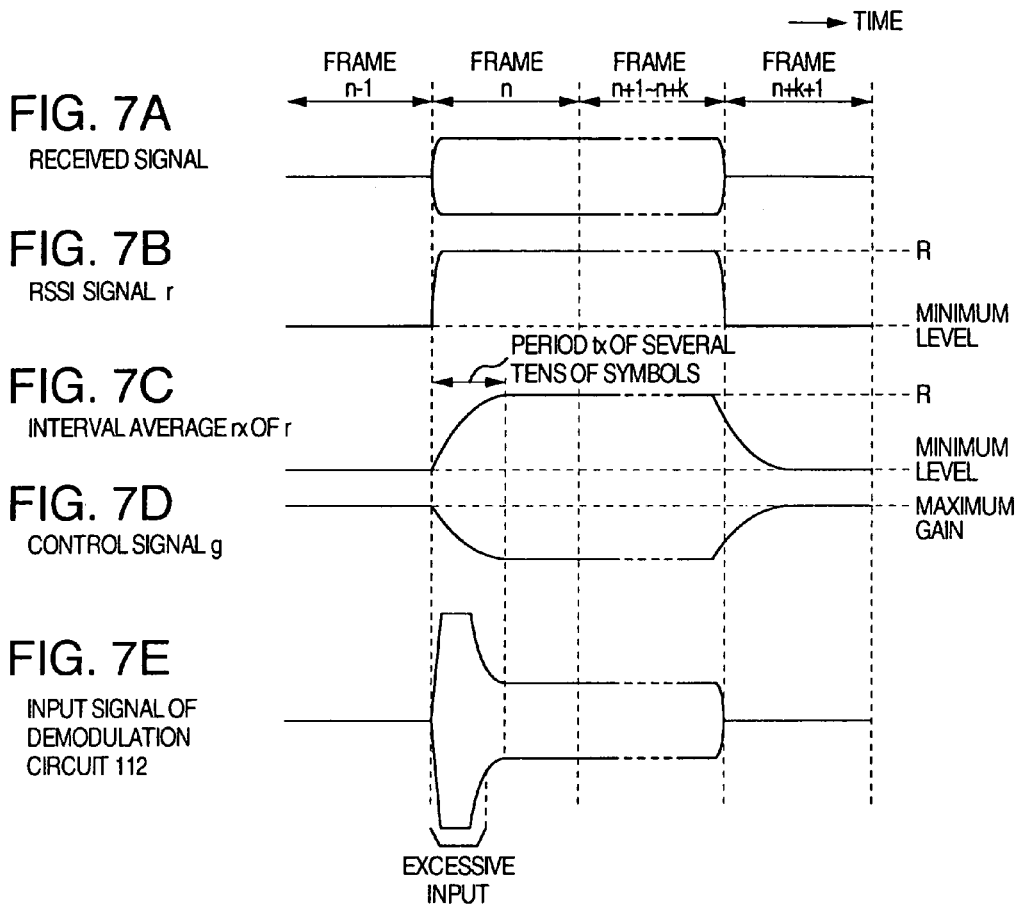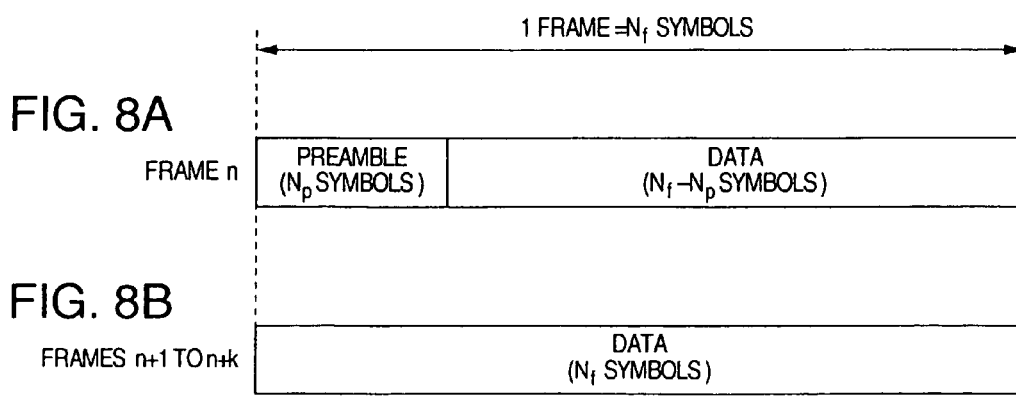

AGC METHOD AND CIRCUIT FOR DIGITAL RADIO RECEIVER

BACKGROUND OF THE INVENTION

The present invention relates to a digital radio receiver, or in particular to an AGC (automatic gain control) method and an AGC circuit for controlling the level of the received signal.

The level of the signal received by the receiver used for digital radio communication changes with the propagation characteristics. An AGC circuit is required, therefore, for controlling the input signal of a demodulator at a constant level regardless of a change in the input signal level. Generally, an AGC circuit uses an amplifier, and the level of the received signal is regulated by changing the gain of the amplifier for amplifying the input signal. A method is widely known, in which a RSSI (received signal strength indicator) signal obtained by logarithmic amplification and envelope detection of the input received signal is used to control the gain of the amplifier.

An AGC method using an interval average of the RSSI signal will be explained with reference to FIG. 1.

FIG. 1 is a block diagram showing an example configuration of a conventional AGC circuit for performing the control operation using the interval average of the RSSI signal. In FIG. 1, reference numeral 101 designates an input terminal, numeral 102 an amplifier (for example, a variable gain amplifier), numeral 103 a RSSI circuit, numeral 104 an A/D (analog-to-digital) converter, numeral 105 an interval average calculation circuit, numeral 110 a gain control unit, numeral 111 a D/A (digital-to-analog) converter and numeral 112 a demodulation circuit.

In FIG. 1, the signal received by the digital radio receiver is applied through the input terminal 101 to the amplifier 102 and the RSSI circuit 103. The RSSI circuit 103 logarithmically amplifies the received signal applied thereto from the input terminal 101, and after envelope detection, outputs a RSSI signal. The RSSI output signal, as the result of logarithmic amplification and envelope detection, is proportional to the logarithm of the received signal level.

FIG. 2 is a block diagram showing in detail an example of the RSSI circuit 103. In FIG. 1, the received signal from the input terminal 101 is applied to an envelope detector 103a, and the output signal of the envelope detector 103a is applied to a logarithmic amplifier 103b, where it is logarithmically amplified. The signal thus logarithmically amplified is further applied to a low-pass filter (LPF) 103c for removing the amplitude variations caused by modulation, and outputted as a RSSI signal. The low-pass filter is intended to remove the amplitude variations due to the modulation and desirably has a time constant of not less than 2 symbols but not more than about 10 symbols. In the description of embodiments that follows, the time constant of the low-pass filter is assumed to be 2 symbols, for example.

FIG. 3 is a characteristic diagram showing the voltage of the RSSI output signal of the RSSI circuit versus the power of the received signal. The received signal power on the abscissa is shown by logarithmic scale, and therefore the output voltage of the RSSI signal is proportional to the logarithm of the received signal power.

The RSSI output signal of the RSSI circuit 103 is converted into a digital signal in the A/D converter 104, and applied to the interval average calculation circuit 105. The RSSI signal, that has passed through the low-pass filter 103c having a time constant of 2 symbols, for example, is sampled by the A/D converter 104 for every 2 symbols. The RSSI signal sampled and converted into a digital signal in this way is hereinafter called an instantaneous value r of the RSSI signal. In the following explanation, the signal processing from the A/D converter 104 to the D/A converter 111 is performed by the digital signal processing, and the period of the operation clock signal (period of the operation clock timing) of this digital signal processing is two symbols. In the radio communication system, signal is generally transmitted and received on a frame unit basis of a predetermined data length. For example, when one frame is 40 msec and formed by 192 symbols, 2 symbols has a period of about 0.42 msec.

The interval average calculation circuit 105 calculates the input RSSI signal (the instantaneous value r of the RSSI signal) with a time constant (time tX) of a period longer than several tens of symbols, and applies the interval average value rX of the instantaneous values r of the RSSI signal providing the result of calculations to the gain control unit 110.

In the gain control unit 110, a control signal g for controlling the gain of the amplifier 102 is produced based on the input interval average value rX, and after being converted into an analog signal by the D/A converter 111, applied to the amplifier 102.

In the amplifier 102, the received signal input from the input terminal 101 is amplified with a gain corresponding to the control signal g input through the D/A converter 111, and the amplified signal is applied to the demodulation circuit 112.

The signal output from the amplifier 102 is a modulated wave, and this modulated wave signal is subjected to frequency change, detection and signal point determination in the demodulation circuit 112 thereby to retrieve the information contained in the modulated wave.

The signal received by the digital radio receiver is segmented for each frame, and the frame is roughly configured of a control information section containing the sync data and a data section. For example, FIG. 4 is a diagram for explaining the frame structure of a sync burst frame according to ARIB STD-T61 providing a standard specification of FDMA (frequency division multiple access). FIG. 5 is a diagram for explaining the frame structure of a traffic channel according to the same specification.

FIGS. 4 and 5, reference characters "LP+R" designates a linearizer preamble and ramp-up section, ad"Pb" a preamble section, "RI" a communication information channel section, "SW" a sync word pattern section, "PI" a parameter information channel section, "G" a guard time section, "Tch a traffic channel section, and "UD" an undefined section. The numeral values described under the respective symbols represent the number of bits for the areas thereof, respectively. The sections "LP+R" and "Pb" make up a control information section, and the remainders constitute a data section. The AGC operation is performed using a part of "LP+R" or "Pb".

In the specification of FIG. 4, the modulation scheme is the π/4 shift QPSK (quaternary phase shift keying), a modulation rate of 4.8 kbaud, a frame length of 40 msec, and 192 symbols (384 bits; 1 symbol=2 bits) per frame.

FIG. 6 is a diagram showing an example of a transmission pattern. In FIG. 6, "$SB_0$" and "$SB_1$" are frames of the sync burst shown in FIG. 4, and "TchN" (N: natural number) a frame of the traffic channel shown in FIG. 5. In the example of FIG. 6, after two frames of sync burst are transmitted, N+1 frames of the traffic channel are transmitted. An explanation will be given below of the case in which the signal of the transmission pattern shown in FIG. 6 is received by the receiver.

FIGS. 7A to 7E are time charts showing the signal waveforms of the various parts for explaining the operation of the AGC circuit of FIG. 1. Specifically, these time charts represent the signal waveforms of the respective parts produced by the AGC operation performed with the interval average value rX of the RSSI signal using the AGC circuit shown in the block diagram of FIG. 1 in the case where the signals of frames n to n+k (n, k: integer) are applied to the receiver. FIG. 7A shows a received signal, FIG. 7B an instantaneous value r of the RSSI signal, FIG. 7C an interval average value rX of the RSSI signal, FIG. 7D a control signal g, and FIG. 7E an input signal to the demodulation circuit 112. In FIGS. 7A and 7E, the actual signal is a modulate wave and only the envelope is plotted by solid line while the modulated wave signal is not shown.

The AGC operation using the interval average value rX of the RSSI signal will be explained with reference to FIGS. 7A to 7E.

As shown in FIG. 7A, the received signal of frames n to n+k is input within the time of frames n−1 to n+k+1. In the frames n−1 and n+k+1 where the received signal is not input, therefore, the instantaneous value r of the RSSI signal assumes a minimum level, while the instantaneous value r of the RSSI signal assumes the level R shown in FIG. 7B in the frames n to n+k where the received signal is input.

The most simple frame structure is configured of preamble and data. The frame n is configured of a preamble and data as shown in FIG. 8A, and the frames n+1 to n+k may each be configured of data only as shown in FIG. 8B. A specific example of the preamble and the data is Nf=192 symbols and Np=44 symbols.

As shown in FIG. 7C, the interval average calculation circuit 105 determines the interval average value of the instantaneous values r (i.e. the average value of the instantaneous values r of the SSI signal during the time length tX) of the RSSI signal with a long time constant of not less than several tens of symbols, and therefore the interval average value rX takes a time for rise. The interval average is defined as an average value of the instantaneous values during a predetermined time length tX before the ith instantaneous value ri (i: arbitrary natural number) detected, and is determined at each detection time point (for every two symbols in the case under consideration) of the instantaneous value r.

Thus, as shown in FIG. 7D, the control signal g is gradually attenuated after assuming a maximum gain at the head of the frame n. As a result, as shown in FIG. 7E, the signal applied to the demodulation circuit 112 becomes an excessive input in the head portion of the frame n.

SUMMARY OF THE INVENTION

For the reason described above, the AGC operation is required to be performed quickly at the rise time of the received signal level.

Specifically, in the case where the received signal is continuously applied, as shown in the portion following to the heads portion in the frame n and the frames n+1 to n+k in FIGS. 7C, 7D, 7E, the AGC operation is required to be performed slowly based on the interval average value rX of the RSSI signal in order to prevent the suppression of the amplitude component contained in the modulated wave. At the rise time of the received signal level, however, a slow pull-in of the AGC operation would make it impossible to follow a sharp rise of the level, and therefore the AGC operation is required to be pulled in quickly.

The RSSI signal is proportional to the logarithm of the received signal level, and therefore by performing the AGC operation using an instantaneous value or a short interval average value (a time constant not more than several symbols, for example) of the RSSI signal, a sharp level change of the received signal-can be followed. In the case where a modulation scheme such as PSK (phase shift keying) or QAM (quadrature amplitude modulation) having no constant amplitude, however, the amplitude component of the modulation is contained in the RSSI signal. An AGC operation performed using the instantaneous value or the short interval average value of the RSSI signal, therefore, would suppress the amplitude component due to the modulation. In order to prevent this suppression, the AGC operation is required to be performed using a long interval average (a time constant of not less than the periods of several tens of symbols).

In the communication between a fixed station and a base station, the AGC operation is required since the propagation characteristics changes when a vehicle etc. moves within the propagation path therebetween.

Further, like the radio communications for business or disaster control, in the communication between a mobile station and a base station, the propagation characteristics and the received signal level change not only while the mobile station is moving, but also after movement of the mobile station. Thus, the AGC operation is required each time of arrival of the received signal. Also, the received signal may be as short as only one frame. In the radio communication for disaster prevention, even the signal of one frame is important and required to be received positively. Thus, the AGC operation is required which can detect the first frame of the received signal without fail.

The object of the present invention is to obviate the disadvantages of the prior art that a sharp level rise of the received signal cannot be followed and to provide an AGC method and an AGC circuit capable of optimum AGC operation both when continuously receiving the received signal and at the rise time of the received signal.

In order to achieve the object described above, the AGC method according to this invention uses an AGC circuit of the receiver for the digital radio communication and is intended to detect the envelope of the received signal (RSSI signal, for example) and upon detection of a rise of the received signal, perform the AGC operation rapidly.

Specifically, according to a first aspect of the invention, there is provided an AGC (automatic gain control) method for a digital radio receiver, wherein the gain of an amplifier is automatically changed in accordance with the level of the signal received by the digital radio receiver thereby to control the gain, the method comprising the steps of:

(a) detecting an instantaneous value of the envelope of the input received signal sequentially at predetermined time intervals;

(b) determining the first interval average value providing an average value of the instantaneous values for a predetermined time length before the instantaneous value detected;

(c) determining a difference value between the instantaneous value and the first interval average value;

(d) in the case where the difference value exceeds a predetermined threshold value, setting, upon the lapse of a third predetermined time length from the time when the difference value exceeds the predetermined threshold value, the gain of the amplifier at a value corresponding to the instantaneous value as of the lapse of the third predetermined time length; and (e) maintaining, during a fourth predetermined time length following the lapse of the third predetermined time length, the gain corresponding to the instantaneous value as of the lapse of the first predetermine time, and after the lapse of the fourth predetermined time length, setting, at each time point of detecting the instantaneous value, the gain to a value corresponding to a first interval average providing an average of the instantaneous values during a predetermined time length before the instantaneous value.

According to another aspect of the invention, there is provided an AGC (automatic gain control) method for a digital radio receiver, wherein the gain of an amplifier is automatically changed in accordance with the level of the signal received by the digital radio receiver thereby to control the gain, the method comprising the steps of:

(a) detecting the instantaneous value of the envelope of the input received signal sequentially at predetermined time intervals;

(b) determining the first interval average value providing an average value of the instantaneous values for a first predetermined time length before the instantaneous value detected, and determining the second interval average providing an average of the instantaneous values during a second predetermined time length shorter than the first predetermined time length before the instantaneous value detected;

(c) determining the difference value between the instantaneous value and the first interval average value;

(d) in the case where the difference exceeds a predetermined threshold value, setting the gain of an amplifier at a value corresponding to the second interval average value during the second predetermined time length before the instantaneous value as of the lapse of the third predetermined time length from the time when the difference exceeds the predetermined threshold value; and (e) maintaining, during a fourth predetermined time length following the lapse of the third predetermined time length, the gain set in step (d), and upon the lapse of the fourth predetermined time length, setting, for each detection time point of the instantaneous value, the gain to a value corresponding to the first interval average value during the first predetermined time length before the instantaneous value.

In the AGC method according to this invention, the time before the lapse of the predetermined time after the difference value exceeds the predetermined threshold value following the input of the received signal is sufficiently long to converge the second internal (short interval) average value.

Further, the time before the lapse of the third predetermined time length and the fourth predetermined time length after the difference value exceeds the predetermined threshold value following the input of the received signal is sufficiently long to converge the first interval (long interval) average value.

Furthermore, in the AGC method according to this invention, the RSSI signal is detected, and the instantaneous value of the detected RSSI signal is assumed to be the instantaneous value r of the envelope of the received signal.

According to still another aspect of the invention, there is provided an AGC (automatic gain control) circuit comprising an amplifier supplied with the signal received by a digital radio receiver, the amplifier controlling the gain by changing the gain automatically in accordance with the signal level of the input received signal, the circuit further comprising:

a detection unit for detecting and outputting the instantaneous value of the envelope of the input received signal sequentially at predetermined time intervals;

a first interval average value calculation unit connected to the detection unit for determining the first interval average value providing the average value of the instantaneous values during a first predetermined time length before the instantaneous value detected by the detection unit;

a second interval average value calculation unit connected to the detection unit for determining the second interval average value providing the average of the instantaneous values during a second predetermined time length shorter than the first predetermined time length before the instantaneous value detected by the detection unit;

a difference calculation unit connected to the detection unit and the first interval average value calculation unit for determining the difference between the detected instantaneous value and the first interval average value;

a switching unit for selectively outputting one of the first interval average value determined by the first interval average value calculation unit and the second interval average value determined by the second interval average value calculation unit;

a switching control unit for controlling the switching unit; and a gain control unit connected to the output of the switching unit for outputting a signal for changing the gain of the amplifier in accordance with the output of the switching unit;

wherein in the case where the difference value calculated by the difference calculation unit exceeds a predetermined threshold value, the switching control unit controls the switching unit in such a manner that the second interval average value during the second predetermined time length before the instantaneous value upon the lapse of the third predetermined time length is applied from the second interval average value calculation unit to the gain control unit upon the lapse of the third predetermined time length after the difference exceeds the predetermined threshold value;

wherein the switching unit is controlled in such a manner that the second interval average value during the second predetermined time length before the instantaneous value upon the lapse of the third predetermined time length continues to be applied to the gain control unit during the time before the lapse of the fourth predetermined time length following the lapse of the third predetermined time length; and wherein upon the lapse of the fourth predetermined time length, the switching unit is controlled in such a manner that the first interval average value determined by the first interval average value calculation unit during the predetermined time length before the instantaneous value is output to the gain control unit at each time point of detecting the instantaneous value.

According to the invention having this configuration, the AGC operation is pulled in rapidly at the rise time of the received signal level by detecting the received signal level. Also, as long as the received signal is received continuously, the AGC operation is performed at low speed with the long interval average of the RSSI signal in order to prevent the suppression of the amplitude component contained in the modulated wave.

BRIEF DESCRIPTION OF THE DRAWINGS

FIG. 4 is a diagram for explaining the frame structure of an example of a sync burst frame.

FIG. 5 is a diagram for explaining the frame structure of an example of a traffic channel.

FIG. 6 is a diagram showing an example of a frame transmission pattern.

FIGS. 7A to 7E are time charts showing the signal waveforms of various parts for explaining the operation of the AGC circuit shown in FIG. 1.

FIGS. 8A and 8B are diagrams showing an example of a frame structure of signal.

DESCRIPTION OF THE EMBODIMENTS

An AGC circuit according to an embodiment of the invention will be explained below with reference to the accompanying drawings.

Figure 1:
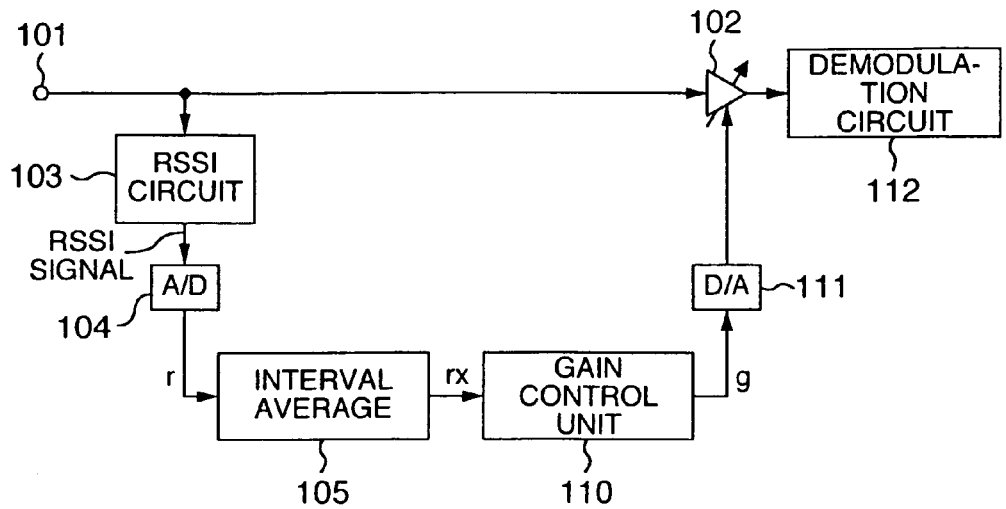
FIG. 1 is a block diagram showing an example of a configuration of a conventional AGC circuit.
Figure 2:
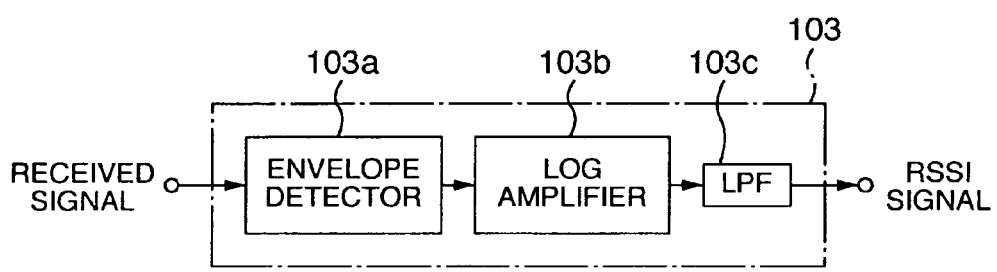
FIG. 2 is a block diagram showing an example of a configuration of a RSSI circuit shown in FIG. 1.
Figure 3:
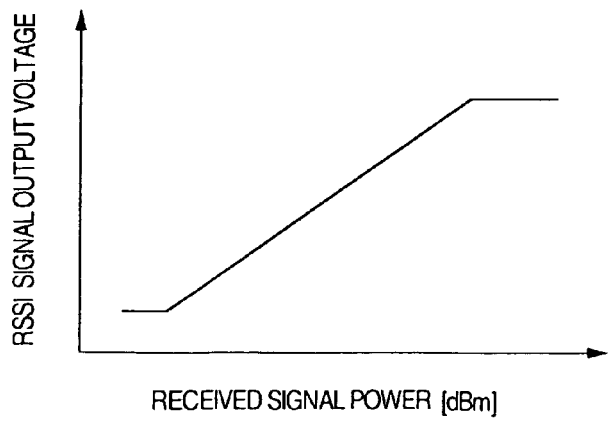
FIG. 3 is a characteristic diagram showing the voltage of the output RSSI signal versus the power of the received signal in the RSSI circuit shown in FIG. 2.
Figure 9:
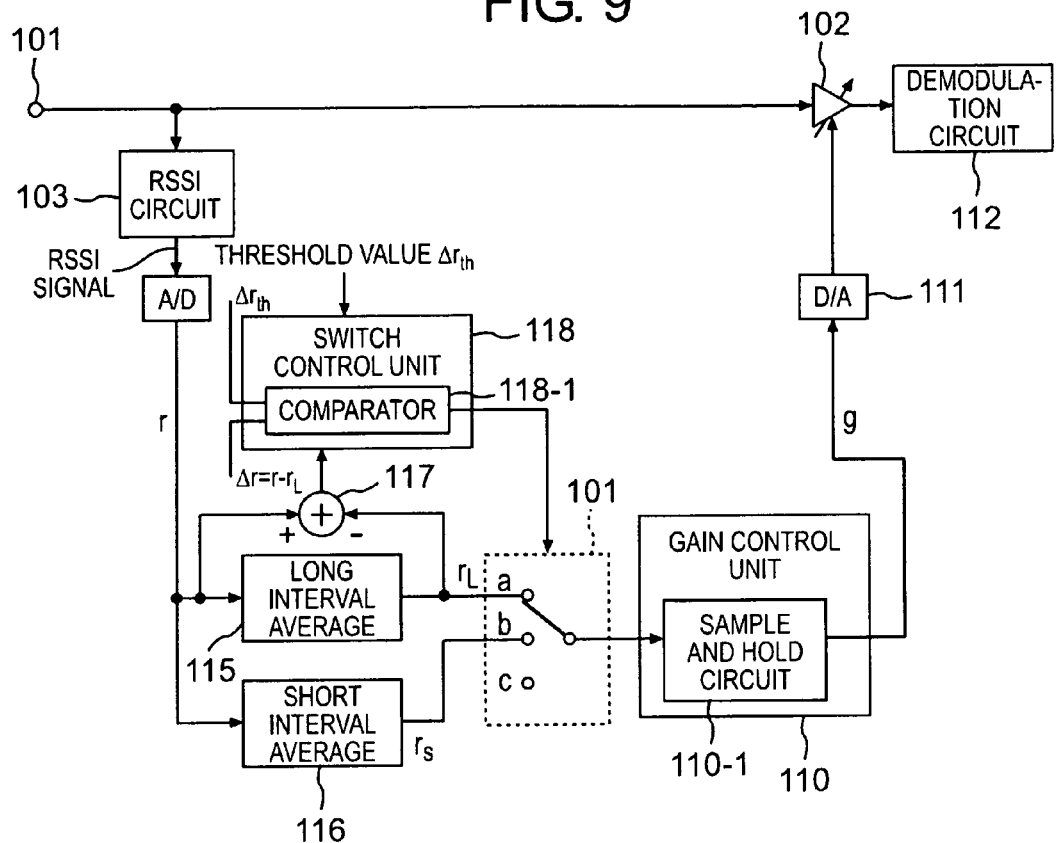
FIG. 9 is a block diagram showing an example of a configuration of the AGC circuit according to an embodiment of the invention.

FIG. 9 is a block diagram showing an example of a configuration of the AGC circuit for implementing the AGC method according to this invention. In FIG. 9, the component elements having the same functions as those described in FIG. 1 are designated by the same reference numerals, respectively. Reference numeral 115 designates a long interval average calculation circuit, numeral 116 a short interval average calculation circuit, numeral 117 an adder, numeral 119 a switch (SW) for selectively applying the output of the long interval average calculation circuit 115 or the output of the short interval average calculation circuit 116 to a gain control unit 110, and numeral 118 a switching control unit for operating the switch 119 in accordance with the output of the adder 117. Now, the control operation of the AGC circuit according to this embodiment will be explained with reference to FIG. 9 and other figures. The signal in the present invention may have either a frame structure as shown in FIGS. 4 to 6, for example, or a simple frame structure as shown in FIGS. 8A, 8B.

In FIG. 9, the signal received by the receiver is applied through an input terminal 101 to an amplifier 102 and a RSSI circuit 103. The functions of the demodulation circuit 112 supplied with the output of the amplifier 102 for performing the demodulation, and the functions of the RSSI circuit 103, the A/D converter 104, the gain control unit 110 and the D/A converter 111 are identical to those of the prior art and therefore will not be explained.

The instantaneous value of the RSSI signal r converted into a digital signal in the A/D converter 104 is applied to the long interval average calculation circuit 115, the short interval average calculation circuit 116 and the input terminal on the positive (plus) side of the adder 117.

In the long interval average calculation circuit 115, like in the interval average calculation circuit 105 shown in FIG. 1, the instantaneous value r is calculated with a time constant longer than several tens of symbols at each time point when the RSSI signal (the instantaneous value r of the RSSI signal) input from the A/D converter 104 is detected, thereby determining and outputting the long interval average value $r_L$ of the instantaneous values r of the RSSI signal (i.e. the average value of the instantaneous values r of the RSSI signal during the time length $t_L$). More specifically, the long interval average calculation circuit 115 calculates, each time the ith instantaneous value ri (i: arbitrary natural number) is input, a long interval average value $r_{Li}$ which is the average value of the instantaneous values r during the predetermined time length $t_L$ before the instantaneous value ri.

The long interval average value $r_L$ of the instantaneous values of the RSSI signal r output from the long interval average calculation circuit 115 is applied to the terminal a of the switch 119 on the one hand and to the negative (minus) input terminal of the adder 117 at the same time.

On the other hand, the short interval average calculation circuit 116 calculates the short interval average value $r_S$ of the RSSI signal r based on the instantaneous value r of the RSSI signal input from the A/D converter 104 is calculated with a time constant as short as several symbols at each time point when the instantaneous value r is detected. Thus, the short interval average value $r_S$ of the instantaneous values r of the RSSI signal (i.e. the average value of the instantaneous values r of the RSSI signal during the time length $t_S$) is determined and applied to the terminal b of the switch 119. More specifically, the short interval average calculation circuit 116 calculates, each time the ith instantaneous value ri is applied thereto, a short interval average value $r_{Si}$ which is the average value of the instantaneous values r during the predetermined time length $t_S$ before the instantaneous value ri.

Figure 10:
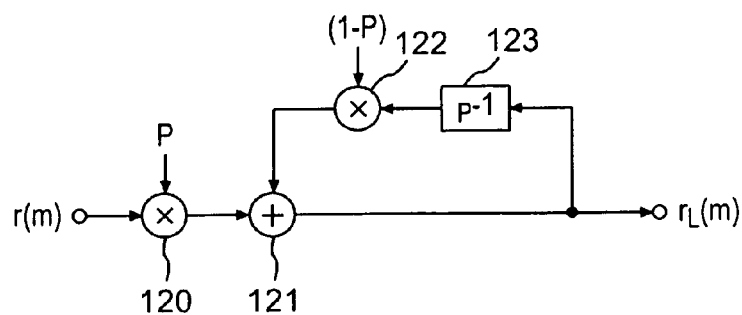
FIG. 10 is a block diagram showing an example of a configuration of the long interval average calculation circuit.

FIG. 10 is a block diagram showing an example of a configuration of the long interval average calculation circuit 115 including multipliers 120, 122, an adder 121 and a delay element 123. In FIG. 10, reference character r(m) designates a RSSI signal output from the A/D converter 104, which, as described above, is a signal sampled for each two symbols, for example. Character $r_L(m)$ designates a long interval average value $r_L$ calculated, and character m designates a sample number p thereof which is assumed to be a constant of 0.03. FIG. 10 can be expressed as an equation below, in which the output $r_L(m)$ is the sum of r(m) multiplied by p plus the smoothed output $r_L(m-1)$ two symbols before, multiplied by (1−p). The delay element 123 is for delaying one sample, i.e. two symbols.

$$r_L(m) = p \times r(m) + (1-p) r_L(m-1)$$

In the case where the sampling period of the RSSI signal is two symbols and p is 0.03, the long interval average value converges to about 80% for 120 symbols (60 samples).

The short interval average calculation circuit 116 has a similar configuration to the long interval average calculation circuit 115 shown in FIG. 10, where p is given as 0.3. The output rs(m) of the short interval average calculation circuit is applied to the terminal b of the switch 119, which output rs(m) converges to about 75% for eight symbols (4 samples).

The switch 119 connects the terminal d selectively to one of the terminals a, b, c in response to a signal from the switching control unit 118. When the terminal d is connected to terminal a, the long interval average value $r_L$ input from the long interval average calculation circuit 115 is applied to the gain control unit 110. When the terminal d is connected to the terminal b, on the other hand, the short interval average value $r_S$ input from the short interval average calculation circuit 116 is applied to the gain control unit 110. When the terminal d is connected to terminal c, the gain control unit 110 holds the output immediately before the particular connection. The terminal c of the switch 119 is supplied with no signal.

Specifically, the gain control unit 110 includes a sample hold unit 110-1, for example, for holding the immediately preceding input signal (the short interval average value $r_S$, for example) while no signal is input thereto.

In the adder (difference calculation unit) 117, the difference value $\Delta ri$ ($\Delta ri = ri - r_{Li}$) between the ith instantaneous value ri of the RSSI signal input from the A/D converter 104 and the long interval average value $r_{Li}$ (i.e. the average value of the instantaneous values during a predetermined time length $t_L$ before the instantaneous value ri) of the RSSI signal input from the long interval average calculation circuit 115 is calculated, and the difference value $\Delta ri$ thus calculated is applied to the switching control unit 118.

The switching control unit 118 includes a comparator 118-1 which compares the difference value $\Delta ri$ with a preset threshold value $\Delta r_{th}$, and by performing the following determining operations (1), (2) and (3), changes the connection of the switch 119 in accordance with the determining operations. In this case, the AGC circuit performs the control operation with clock timings shown in FIG. 12J. In the case where the AGC circuit is in standby state awaiting the arrival of a received signal input, however, the switch 119 normally connects the terminal a to the terminal d.

Determining operation (1): Before a time point where the difference value $\Delta ri$ exceeds the threshold value $\Delta r_{th}$, the terminal a of the switch 11 is connected to the terminal d, and the long interval average value $r_{Li}$ output from the long interval average calculation circuit 115 is applied to the gain control unit 110 (low-speed process).

Upon lapse of a predetermined time $t_1$ from the time point when the difference value $\Delta ri$ has exceeded the threshold value $\Delta r_{th}$, the terminal b of the switch 119 is connected to the terminal d, the short interval average value $r_{Si}$ output from the short interval average circuit 116 is applied to the gain control unit 110, and the state of the gain control unit 110 is preset by the value $r_{Si}$ (start of high-speed process).

Determining operation (2): At the next operation clock timing after presetting the state of the gain control unit 110 by the short interval average value $r_{Si}$, the terminal c of the switch 119 is connected to the terminal d, and the state of the gain control unit 110 is held (high-speed process).

Determining operation (3): Upon lapse of the predetermined time $t_1 + t_2$ from the time point when the difference value $\Delta ri$ has exceeded the threshold value $\Delta r_{th}$, the terminal a of the switch 119 is connected to the terminal d, and the long interval average value $r_L$ output from the long interval average calculation circuit 115 is applied to the gain control unit 110 (low-speed process). In this case, the predetermined time $t_1 + t_2$ is a time period during which the long interval average calculation circuit 115 starts calculation, then converges the calculation and the long interval average value $r_L$ converges.

The long interval average calculation circuit 115 and the short interval average calculation circuit 16 always calculate and output the long interval average value $r_L$ and the short interval average value $r_S$, respectively, by operating in response to each instantaneous value r of the RSSI signal input at each operation clock timing. When the long interval average value $r_L$ or the short interval average value $r_S$ is applied to the gain control unit 110 from the switch 119, the gain control unit 110 calculates and outputs the control signal g based on the value $r_L$ or $r_S$ applied thereto. In the case where the terminals c and d of the switch 119 are connected to each other, on the other hand, the immediately preceding calculated value of the control signal g is held and output. The control signal g output from the gain control unit 110 is converted into an analog signal by the D/A converter 111, and applied to the control terminal of the amplifier 102 thereby to control the gain of the amplifier 102 by a well-known method.

The amplifier 102 changes the gain in accordance with the value of the control signal input thereto from the D/A converter 111, amplifies the received signal input from the input terminal 101 and applies the amplified signal to the demodulation circuit 112.

FIGS. 11A to 11G, like FIGS. 7A to 7E, are time charts showing signal waveforms of various parts for explaining the operation of the AGC circuit in the case where the AGC operation is performed by the AGC circuit shown in FIG. 9 for the signal of frame n to frame n+k (n, k: integer) received by the receiver. FIGS. 12A to 12J are time charts plotted in enlarged form for the time length of the several tens of symbols from the head of the frame n. The AGC circuit shown in FIG. 9 is operated in synchronous with the operation clock signal shown in FIG. 12J. The operation of the AGC circuit shown in FIG. 9 will be explained with reference to FIGS. 11A to 11G and FIGS. 12A to 12I. In FIGS. 11A to 11G and FIGS. 12A to 12I, FIGS. 11A, 12A show a received signal, FIGS. 11B, 12B an instantaneous value r of the RSSI signal, FIGS. 11C, 12C a long interval average value $r_L$ of the RSSI signal, FIGS. 11D, 12D a short interval average value rs of the RSSI signal, FIGS. 11E, 12E a difference value $\Delta r$ ($\Delta r = r - r_L$), FIGS. 11F, 12F a control signal g, FIGS. 11G, 12G an input signal of the demodulation circuit 112, FIG. 12H the manner in which the switch 119 is controlled by the switching control unit 18, and FIG. 12I an input signal of the gain control unit 110. In FIGS. 11A, 12A, 11G, 12G, the actual signal is a modulated wave, and only the envelope is plotted in solid line while the modulated wave signal is not shown.

Figure 11:
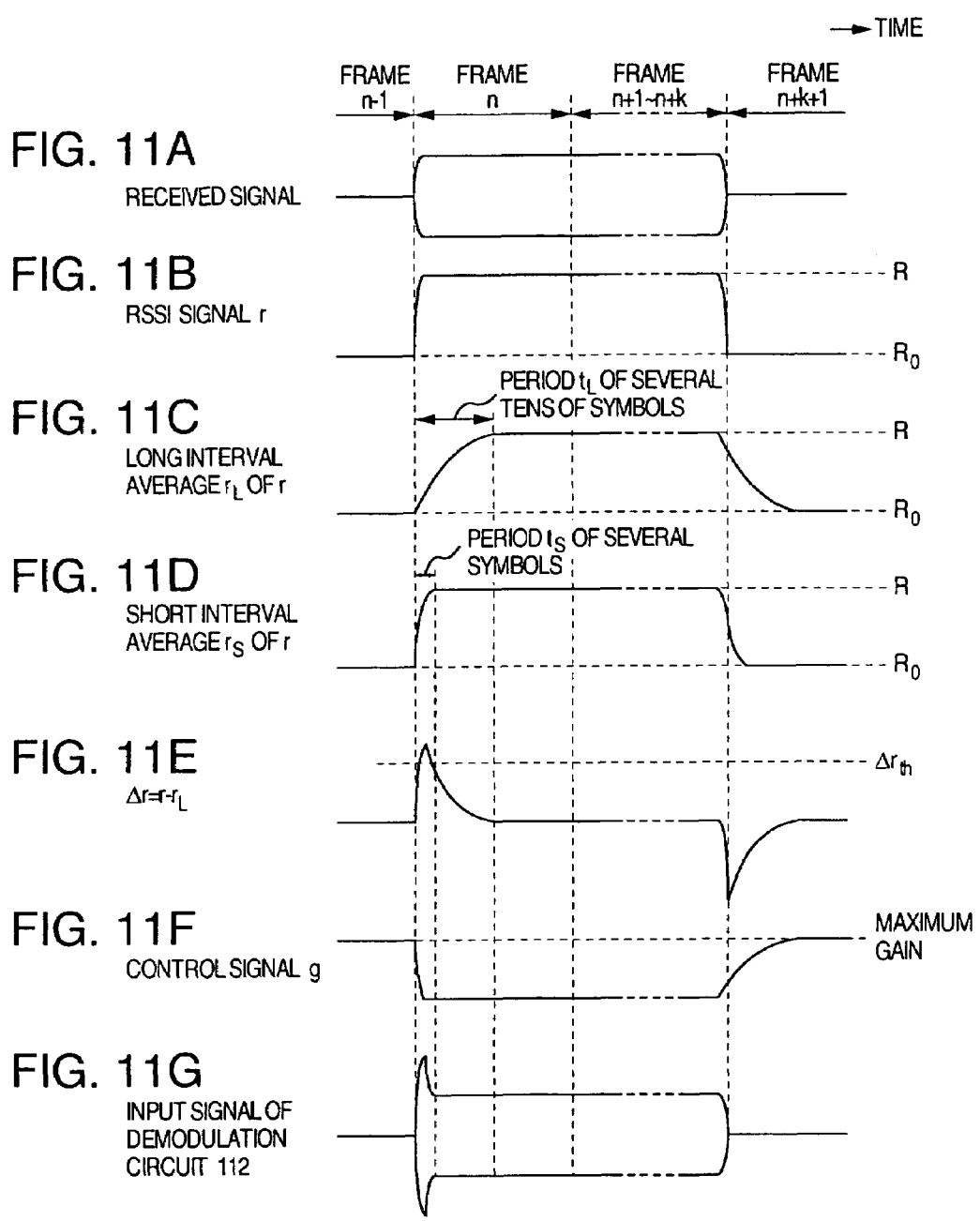
FIGS. 11A to 11G are time charts showing the signal waveforms of the various parts for explaining the AGC circuit shown in FIG. 9.
Figure 12:
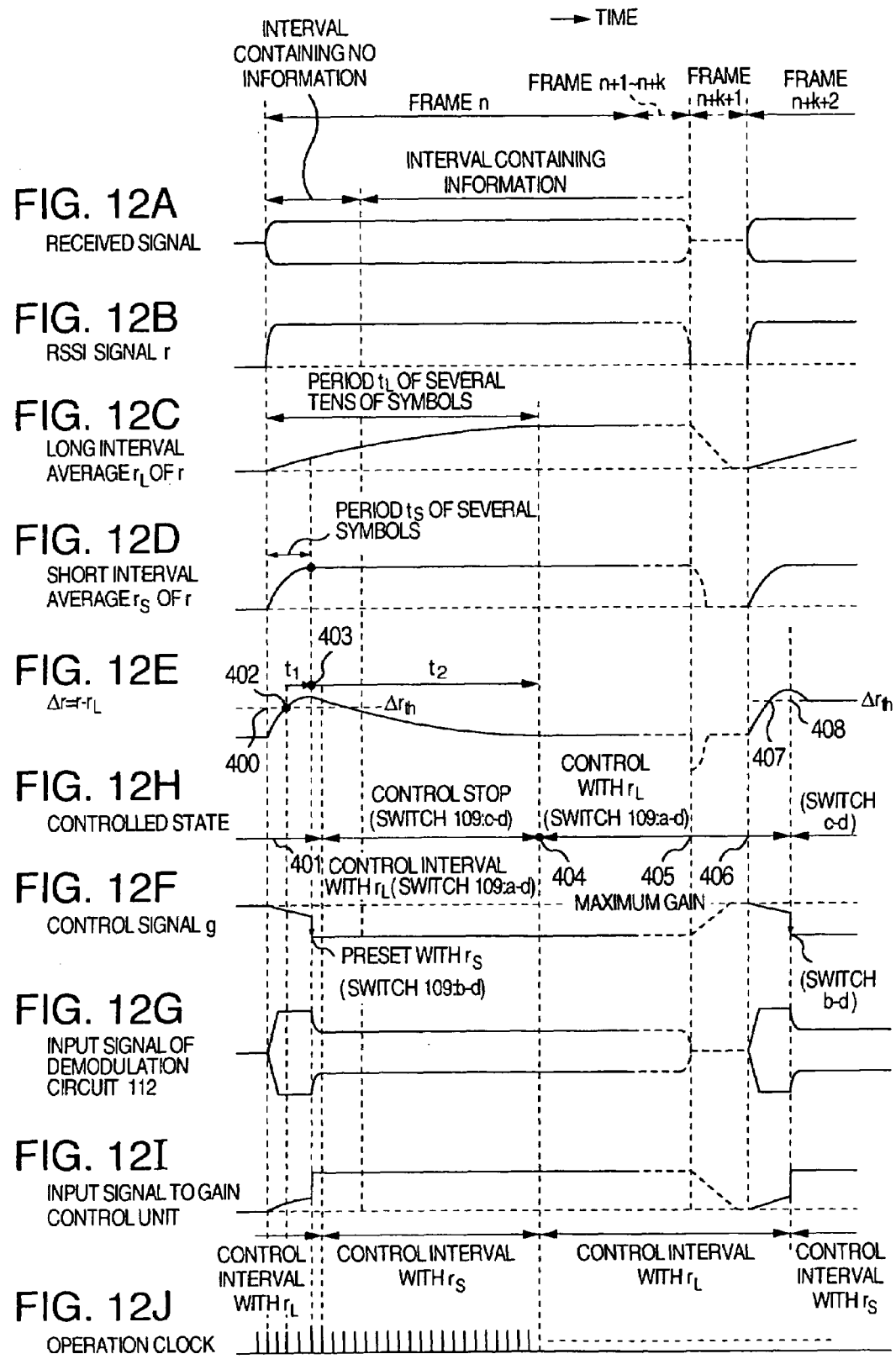
FIGS. 12A to 12J are time charts showing the signal waveforms of the various parts for explaining the AGC circuit shown in FIG. 9.

In FIGS. 11A to 11G and FIGS. 12A to 12I, the signal is received from the frame n to frame n+k. As shown in FIGS. 11B, 12B, the instantaneous value r of the RSSI signal assumes a level R for the frame n to frame n+k, while the instantaneous value r assumes a minimum level R0 for the other frames. In FIGS. 12A to 12I, the signal is assumed to be received even for the frame n+k+2.

The long interval average value $r_L$ of the RSSI signal is calculated by the long interval average calculation circuit 115 with a time constant of several tens of symbols, as shown in FIGS. 11C, 12C, and therefore the time corresponding to several tens of symbols is consumed for rise.

The difference value $\Delta r$ ($= r - r_L$) between the instantaneous value r of the RSSI signal and the long interval average value $r_L$, as shown in FIG. 11E, is the difference between two signals of different rise time. Therefore, a positive value is exhibited at the rise time and a negative value at the fall time of the received signal level.

The AGC circuit shown in FIG. 9 detects the rise of the received signal level and selects an optimum AGC control method utilizing the characteristics of the difference value Δr described above. Specifically, when the received signal is received continuously, the AGC operation is performed with the long interval average value $r_L$ of the RSSI signal, while at the rise time of the received signal, the AGC operation is performed with the short interval average value $r_S$ of the RSSI signal or the instantaneous value of the RSSI signal.

The AGC operation will be described in detail with reference to FIGS. 12A to 12I. The power supply (not shown) for the AGC circuit is turn on and the RSSI signal begins to be received. The AGC operation is performed with the long interval average value $r_L$ until immediately after the time point 400 (interval 401) when the signal is received in the frame n. As described above, the long interval average value $r_{Li}$ at the time point when the ith instantaneous value ri (i: arbitrary natural number) is input is an average value of the instantaneous values r during a predetermined time length $t_L$ before the instantaneous value ri. Therefore, the long interval average value $r_L$ before the time point 400 when the frame n is received is R0, and gradually increases after the time point 400 (see FIG. 12C). Thus, the difference value Δr ($=r-r_L$) remains 0 until the time point 400 when the frame n is received, and subsequently gradually increases (see FIG. 12E).

After the power for the AGC circuit is turned on, until the difference value Δr exceeds the preset threshold value $Δr_{th}$ (time point 402) and further a specified time $t_1$ elapses at time point 403, the terminal d remains connected to the terminal a of the switch 119, and the AGC operation is performed by the long interval average value $r_L$ of the RSSI signal. Thus, the input signal of the gain control unit 110, as shown in FIG. 12I, gradually increases from time point 400 to time point 403 in accordance with the long interval average value $r_L$. Therefore, the signal input to the demodulation circuit 112 changes in the manner shown in FIG. 12G.

At the time point 403 upon the lapse of a specified time $t_1$ from the time point 402 when the difference value Δr has exceeded the preset threshold value $Δr_{th}$, the terminal d of the switch 119 is turned to the terminal b, and the value of the control signal g is preset to a value based on the short interval average value $r_S$. The value of the control signal g, after being thus preset, is fixed (the terminal d of the switch 119 is connected to the terminal c) during the specified time $t_2$ (until the time point 404 when the AGC operation is restarted by the long interval average value of the RSSI signal in FIG. 12G), and at time point 404, the AGC operation by the long interval average value $r_L$ is restored (the terminal d of the switch 119 is connected to the terminal a).

The time until the lapse of the predetermined time $t_1$ from the time point when the difference value Δr has exceeded a predetermined threshold value $Δr_{th}$ after the received signal is input is a sufficient length of time for the short interval average value $r_S$ to converge.

Further, the time length until the lapse of the predetermined time $t_1$ and the predetermined time $t_2$ from the time point when the difference value Δr has exceeded the predetermined threshold value $Δr_{th}$ after the received signal input is sufficiently long for the long interval average value $r_L$ to converge.

In this manner, the predetermined time $t_1$ is a time sufficient for the short interval average value $r_S$ to converge, and the predetermined time $t_2$ is a time sufficient for the long interval average value $r_L$ to converge.

In this way, at the time point 403 when the difference value Δr has exceeded the predetermined value and the short interval average value rs has settled during the interval containing no information after arrival of the received signal of the frame n, the AGC operation is performed by presetting the control signal g based on the short interval average value rs, after which the AGC operation is switched to the one based on the long interval average $r_L$ at the time point 404 after the long interval average value $r_L$ is settled.

As a result, at the rise time of the received signal level, the AGC operation is performed quickly during the interval containing no information in the frame. As long as the received signal is continuously received, on the other hand, the AGC operation is performed at low speed with the long interval average of the RSSI signal in order to prevent the suppression of the amplitude component contained in the modulated wave. In this way, the proper AGC method can be selected in accordance with the receiving condition.

Now, with reference to FIGS. 12A to 12J, an explanation will be given of the case in which after receiving the signal in the frame n+k, no signal is received in the next frame n+k+1, and the signal is received in the second next frame n+k+2. In this case, during the time from the time point 405 when the frame n ends to the time point 408 associated with the frame n+k+2 (i.e. the time point when the difference value Δr exceeds the threshold value $Δr_{th}$ (time point 407) and further upon the lapse of the specified time $t_1$), the terminal d of the switch 119 remains connected to the terminal a. At time point 408, the terminal d of the switch 119 is turned to the terminal b, and the value of the control signal g is preset to a value based on the short interval average value $r_S$.

The required information can be received efficiently by performing this high-speed process before the end of the interval of the data uniquely specified for a communication system containing no transmission information in the received frame (the interval containing no information in the received frames (say, LP+R, Pb of FIGS. 4 and 5)) after the end of the AGC operation (after the convergence of the amplitude of the input signal (FIG. 12G) of the demodulation circuit 112). Specifically, the AGC operation and the high-speed sync process are performed during the interval containing no information in the frame n in FIGS. 12A to 12I. This requires that the time constant for determining the short interval average value $r_S$ for high-speed sync process (the time length $t_S$ to determine the average value) is set to a time shorter than the time length of the interval containing no information in the received frame, less the time required for the AGC operation (the time length from the time point when the control signal g is preset to the time point when the amplitude of the input signal of the demodulation circuit 112 (FIG. 12G) converges), and also less the time required for the high-speed sync process. This example will be further explained with reference to FIG. 4.

When receiving the frame of the sync burst shown in FIG. 4, the linearizer preamble line-up (LR+R) and the preamble (Pb) are received at the head of the frame.

According to the specification shown in FIG. 4, the linearizer preamble line-up (LR+R) may or may not be output from the transmitter, and therefore it is not determined whether it is contained in the received signal or not. Also, the preamble (Pb) contains 44 symbols of the fixed pattern. The information to be transmitted is not contained in (LR+R) and (Pb), and therefore only the preamble (Pb) may be received. Thus, consider the case in which the preamble (Pb) alone is received as an interval containing no information in the received frame.

The period of about 6 symbols is consumed until the amplitude of the input signal of the demodulation circuit 112 converges after the control signal g is preset (time point 403 in FIG. 12F), and about 15 symbols is additionally required for the high-speed sync process. In the frame of the sync burst shown in FIG. 4, the preamble (Pb) period is 44 symbols (88 bits). Thus, the time constant of the short interval average value is required to be smaller than the 23 symbols (44−6−15). In other words, the time sufficient for the short interval average value to converge is required to be smaller than the 23 symbols.

As already described, the RSSI signal contains the amplitude component due to the modulation, and the RSSI signal level changes depending on the information transmitted. In the case where the AGC operation is performed in accordance with the long interval average value $r_L$ of the RSSI signal, the time constant of the long interval average value $r_L$ (the time length $t_L$ for which the average value is determined) is required to be at least several tens of symbols in order to prevent the suppression due to the modulation.

Thus, the time length from immediately after the start of signal reception to the time point when the difference value $\Delta r$ of FIG. 12E reaches the threshold value $\Delta r_{th}$ (time point 402 in FIG. 12E), plus the additional lapse of time $t_1$, is set to a sufficient time length $t_S$ ($t_S$ is smaller than the time from immediately after start of signal reception to time point 402, plus $t_1$) for the convergence of the short interval average value $r_S$. Also, the time length from immediately after start of signal reception to the time point 403 and additional lapse of the time $t_2$, on the other hand, is set to a time length $t_L$ ($t_L$ is shorter than the time from immediately after start of signal reception to the time point 402, plus $t_1$ and $t_2$) sufficient for the convergence of the long interval average value $r_L$. The time before the difference value $\Delta r$ in FIG. 12E reaches the threshold value $\Delta r_{th}$ is about one symbol or two. In the case where the time constant of the short interval average is set to six symbols and the time constant of the long interval average is set to 30 symbols, for example, the time $t_1$, is set to 5 symbols and the time $t_2$ to 24 symbols.

As described above, according to this embodiment, the difference value $\Delta r$ (=$r-r_L$) between the instantaneous value of the RSSI signal and the long interval average value $r_L$ is compared with the threshold value $\Delta r_{th}$. In this way, the rise of the received signal can be detected, so that even a sharp rise of the received signal level can be followed by the AGC operation.

In the embodiment described above, at the rise time of the received signal, the RSSI signal is calculated with a time constant of about several symbols to calculate the short interval average value, and after the short interval average is settled, the control signal g is preset by the short interval average value. According to this invention, however, the terminal b of the switch 119 may be connected directly to the A/D converter 104 without using the short interval average calculation circuit 116. In this case, the switching control unit 118 turns the switch 119 from terminal a to terminal b when the difference value $\Delta r$ reaches the threshold value $\Delta r_{th}$ (i.e. when the rise is detected), and presets the control signal g with the instantaneous value r of the RSSI signal, immediately followed by switching from terminal a to terminal c. Also, upon lapse of the time $t_1+t_2$ after presetting the control signal g, the connection of the terminal d of the switch 119 is turned from terminal c to terminal a, and the AGC operation is performed in accordance with the long interval average value $r_L$ of the RSSI signal.

Also, in the determining operation (2) of the embodiment described above, the switch 119 has the terminal c to which no signal is applied, and by connecting the terminals c and d, the application of the input signal is prevented. As an alternative, any means can of course be employed obviously in which the switch 119 is disconnected by the signal from the switching control unit 118. As still another alternative, in the determining operation (2), the immediately preceding gain set for the amplifier 102 may be maintained by preventing, by disconnection, for example, the control signal g from being applied to the amplifier 102 from the gain control unit 110.

Figure 13:
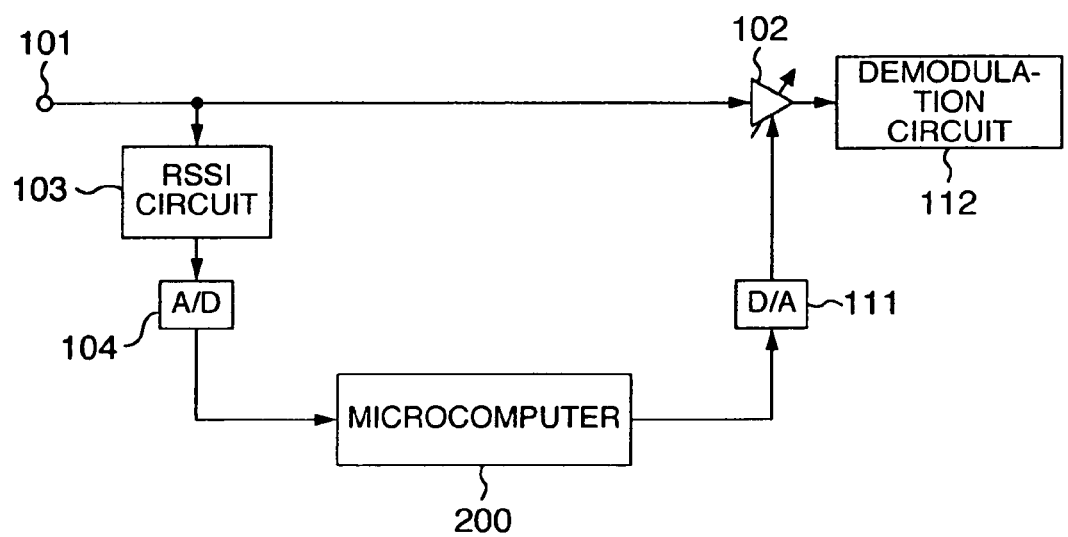
FIG. 13 is a block diagram showing a configuration of an AGC circuit according to another embodiment of the invention.
Figure 14:
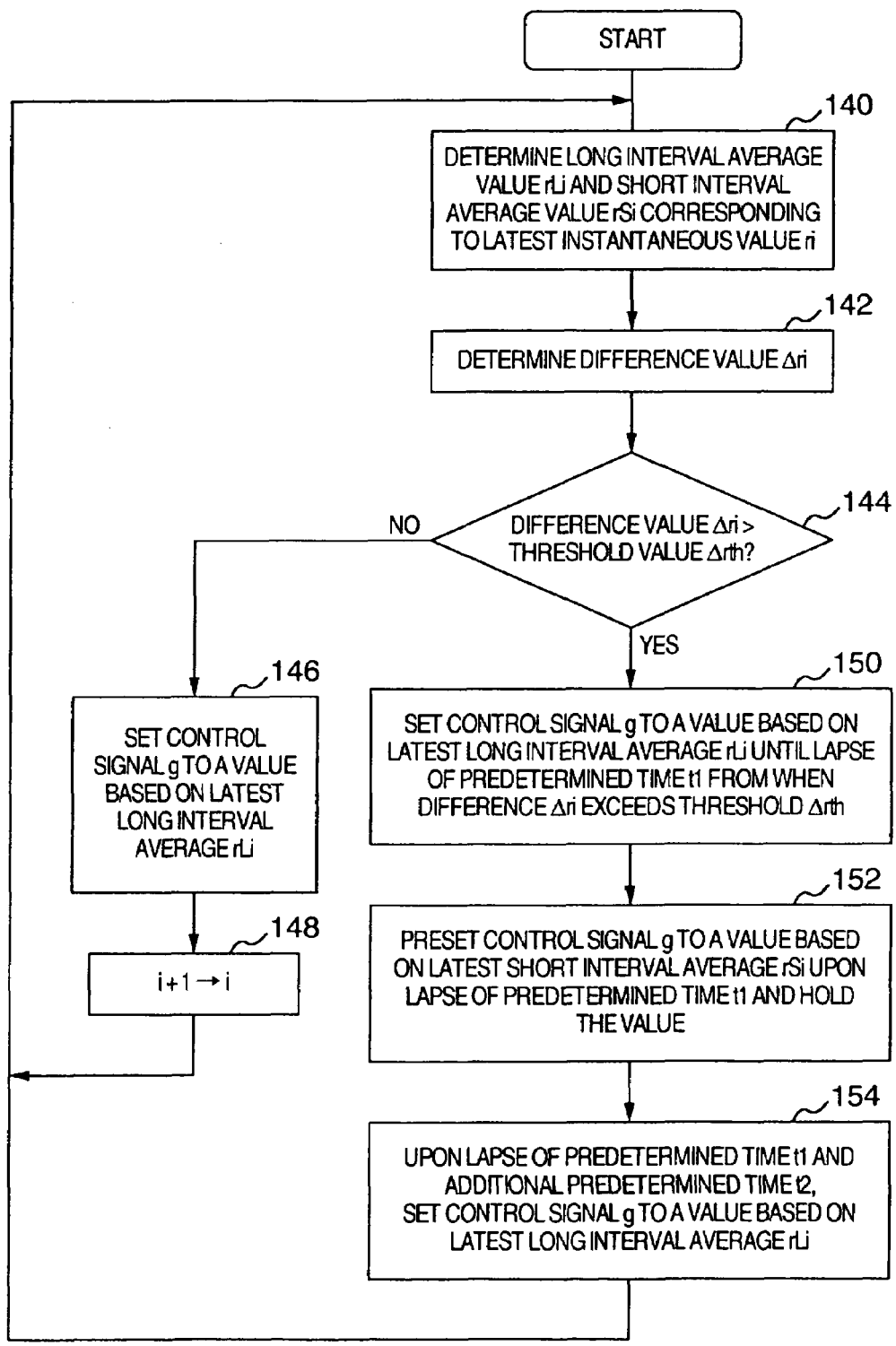
FIG. 14 is a flowchart showing the operation of processing a microcomputer according to the embodiment shown in FIG. 13.

Also, in the embodiment of FIG. 9, the long interval average calculation circuit 115, the short interval average calculation circuit 116, the adder 117, the switching control unit 118, the switch 119 and the gain control unit 110 may be processed by a microcomputer such as a DSP (digital signal processor). FIG. 13 is a block diagram showing such a configuration of the AGC circuit according to another embodiment of the invention. The functions of the component elements 115 to 119 in FIG. 9 are implemented, for example, by a DSP 200. The processing operation of the DSP 200 will be explained with reference to the flowchart of FIG. 14.

First, in step 140, the long interval average value $r_{Li}$ and the short interval average value $r_{Si}$ corresponding to the latest instantaneous value ri input from the A/D converter 104 are determined. Then, the difference value $\Delta ri$ (=$ri-r_{Li}$) between the instantaneous value ri and the long interval average value $r_{Li}$ is calculated (step 142) thereby to determine whether the difference value $\Delta ri$ has exceeded a predetermined threshold value $\Delta r_{th}$ or not (step 144). In the case where the difference value $\Delta ri$ has exceeded a predetermined threshold value $\Delta r_{th}$, the process proceeds to step 150, and otherwise the process is passed to step 146. In step 146, the value of the control signal g is set to a value based on the latest long interval average $r_{Li}$, so that the value i is updated by 1 in step 148, followed by returning to step 140. In step 150, the value of the control signal g is maintained at a value based on the latest long interval average $r_{Li}$ until the lapse of a predetermined time $t_1$ after the difference value $\Delta ri$ has exceeded the threshold value $\Delta r_{th}$. Then, in step 152, upon the lapse of the predetermined time $t_1$, the value of the control signal g is preset and held to a value based on the latest short interval average value $r_{Si}$ upon the lapse of the predetermined time $t_1$. Then, in step 154, upon the lapse of the predetermined time $t_1$ and the further lapse of the predetermined time $t_2$, the control signal g is set to a value based on the latest long interval $r_{Li}$. After that, the process is returned to step 140.

In the embodiment of FIG. 9, only the switching control unit 118 may be processed by a microcomputer such as a DSP.

It will thus be understood from the foregoing description that according to this invention, the AGC operation is rapidly pulled in at the time of rise of the received signal level by detecting the received signal level. Also, as long as the received signal is continuously received, the AGC operation is performed at low speed with the long interval average of the RSSI signal in order to prevent the suppression of the amplitude component of the modulated wave. As a result, a proper AGC method can be selected in accordance with the receiving conditions.

The invention claimed is:
1. An Automatic Gain Control (AGC) method for a digital radio receiver, wherein a gain of an amplifier of said receiver is automatically changed in accordance with a level of a signal received by the digital radio receiver thereby to control a gain, the method comprising the steps of:
(a) detecting instantaneous values of envelope of the input received signal sequentially at predetermined time intervals;

(b) determining a first interval average value providing an average of instantaneous values for a first predetermined time length before an instantaneous value detected, and determining a second interval average value providing an average of the instantaneous values during a second predetermined time length shorter than the first predetermined time length before the instantaneous value detected;

(c) determining a difference between the instantaneous value and the first interval average value;

(d) in the case where the difference exceeds a predetermined threshold value, setting the gain of the amplifier at a value corresponding to the second interval average value during the second predetermined time length before the instantaneous value upon the lapse of a third predetermined time length from the time when the difference exceeds the predetermined threshold value; and (e) maintaining, during a fourth predetermined time length following the lapse of the third predetermined time length, the gain to the value set in step (d), and at each detection time point of the instantaneous value after the lapse of the fourth predetermined time length, setting the gain to a value corresponding to the first interval average value during the first predetermined time length before the instantaneous value.

2. An AGC method according to claim 1, further comprising the step of:

setting, until the lapse of said third predetermined time length, the gain of said amplifier to a value corresponding to the first interval average value providing an average of the instantaneous values during a first predetermined time length before the instantaneous value.

3. An AGC method according to claim 1, wherein the time length before the lapse of said third predetermined time length and said fourth predetermined time length after the received signal is input and said difference value exceeds said threshold value, is sufficient for said first interval average value to converge.

4. An AGC method according to claim 1, wherein the time length before the lapse of said third predetermined time length after the received signal is input and said difference value exceeds said threshold value is sufficient for said second interval average value to converge.

5. An AGC method according to claim 1, wherein a Received Signal Strength Indicator (RSSI) signal is detected from said received signal, and the instantaneous value of said detected RSSI signal is assumed to be said instantaneous value for said envelope of said received signal.

6. An AGC method according to claim 1, wherein said received signal has a frame structure, and said step (d) is executed during the interval not containing the information of said frame structure.

7. An Automatic Gain Control (AGC) circuit comprising an amplifier supplied with a signal received by a digital radio receiver, the amplifier controlling a gain by changing a gain automatically in accordance with a signal level of the input received signal, the circuit further comprising:

a detection unit for detecting and outputting an instantaneous value of an envelope of the input received signal sequentially at predetermined time intervals;

an interval average value calculation unit connected to the detection unit for determining a first interval average value providing an average of instantaneous values during a first predetermined time length before an instantaneous value detected by the detection unit, and also determining a second interval average value providing an average of instantaneous values during a second predetermined time length shorter than said first predetermined time length before the instantaneous value detected by the detection unit;

a difference calculation unit connected to the detection unit and said interval average value calculation unit for determining a difference between the detected instantaneous value and the first interval average value;

a switching unit for selectively outputting one of the first interval average value and the second interval average value determined by the interval average value calculation unit;

a switching control unit for controlling the switching unit; and a gain control unit connected to the output of the switching unit for outputting a signal for changing the gain of the amplifier in accordance with the output of the switching unit, wherein in the case where the difference calculated by the difference calculation unit exceeds a predetermined threshold value, the switching control unit controls the switching unit in such a manner as to output the second interval average value to said gain control unit, wherein the switching unit is controlled in such a manner that the second interval average value as of a time point when said difference exceeds said predetermined threshold value continues to be applied to the gain control unit until lapse of a third predetermined time length and a fourth predetermined time length after said difference exceeds said predetermined threshold value, and wherein after lapse of said third predetermined time length and said fourth predetermined time length, the switching unit is controlled in such a manner that the first interval average value determined by the interval average value calculation unit during the predetermined time length before the instantaneous value is output to the gain control unit at each time point of detecting the instantaneous value.

8. An AGC circuit according to claim 7, wherein said detection unit detects a RSSI signal from the received signal and outputs the instantaneous value of the detected RSSI signal as said instantaneous value of said envelope of said received signal.

9. An Automated Gain Control (AGC) circuit comprising a amplifier supplied with a signal received by a digital radio receiver for controlling gain by changing the gain automatically in accordance with a signal level of the input received signal, the circuit further comprising:

a detection unit for detecting and outputting an instantaneous value of an envelope of the input received signal sequentially at predetermined time intervals;

a first interval average value calculation unit connected to the detection unit for determining a first interval average value providing an average of the instantaneous values during a first predetermined time length before an instantaneous value detected by the detection unit;

a second interval average value calculation unit connected to the detection unit for determining a second interval average value providing an average of the instantaneous values during a second predetermined time length shorter than the first predetermined time length before the instantaneous value detected by the detection unit;

a difference calculation unit connected to the detection unit and the first interval average value calculation unit for determining a difference between the detected instantaneous value and the first interval average value;

a switching unit for selectively outputting one of the first interval average value determined by the first interval average value calculation unit and the second interval average value determined by the second interval average value calculation unit;

a switching control unit for controlling the switching unit; and a gain control unit connected to the output of the switching unit for outputting a signal for changing the gain of the amplifier in accordance with the output of the switching unit, wherein in the case where the difference calculated by the difference calculation unit exceeds a predetermined threshold value, the switching control unit controls the switching unit in such a manner that the second interval average value during the second predetermined time length before the instantaneous value as of the lapse of the third predetermined time length is applied, upon lapse of the third predetermined time length after the difference exceeds the predetermined threshold value, from the second interval average value calculation unit to the gain control unit, wherein the switching unit is controlled in such a manner that the second interval average value during the second interval average value before the instantaneous value as of the lapse of the third predetermined time length continues to be applied to the gain control unit until the lapse of the fourth predetermined time length after the third predetermined time length, and wherein upon the lapse of the fourth predetermined time length, the switching unit is controlled in such a manner that the first interval average value determined by the first interval average value calculation unit during the predetermined time length before the instantaneous value is output to the gain control unit at each time point of detecting the instantaneous value.

10. An Automatic Gain Control (AGC) circuit for a digital radio receiver, comprising:

an input terminal for inputting a received input signal;

an amplifier coupled to said input terminal;

a demodulator coupled to said amplifier;

a detection unit, coupled to said input terminal, for detecting an instantaneous value of an envelope of the input received signal sequentially at predetermined time intervals;

a long interval average value calculation unit, coupled to the detection unit, for determining a long interval average value providing an average of instantaneous values during a first predetermined time length;

a short interval average value calculation unit, coupled to the detection unit, for determining a short interval average value providing an average of instantaneous values during a second predetermined time length shorter than said first predetermined time length;

a gain controller, coupled to said amplifier, for controlling an amplifier of said amplifier; and a switching control unit, coupled to said short and long interval average value calculation units, for selectively controlling to apply one of the short interval average value and the long interval average value to said gain controller.

11. An AGC circuit according to claim 10, further comprising a calculation unit for obtaining a difference between the detected instantaneous value and the long interval average value, and a comparator for comparing the difference with a predetermined threshold value.

12. An AGC circuit according to claim 11, wherein said gain controller includes a sample and hold circuit for holding the short interval average value from said short interval average value calculation unit.

13. An Automatic Gain Control (AGC) method for a digital radio receiver, wherein a gain of an amplifier of said receiver is automatically changed in accordance with a level of a signal received by the digital radio receiver thereby to control a gain, the method comprising the steps of:

(a) detecting an instantaneous value of an envelope of the input received signal sequentially at predetermined time intervals;

(b) determining a first interval average value providing an average of the instantaneous value for a first predetermined time length, and determining a second interval average value providing an average of the instantaneous value for a second predetermined time length;

(c) determining a difference between the instantaneous value and said first interval average value; and (d) in the case where the difference exceeds a predetermined threshold value, setting the gain of the amplifier corresponding to the second interval average value after a predetermined third time length from said case occurred.

14. An AGC method according to claim 13, further comprising the step of:

(e) maintaining gain of the amplifier corresponding to the second interval average value, during a fourth interval time length following the lapse of a third interval time length, and setting the gain of the amplifier corresponding to the first interval average value after a fourth interval time length.

* * * * *